US009893043B2

(12) United States Patent
Chen et al.

(10) Patent No.: US 9,893,043 B2
(45) Date of Patent: Feb. 13, 2018

(54) METHOD OF MANUFACTURING A CHIP PACKAGE

(71) Applicant: Taiwan Semiconductor Manufacturing Company, Ltd., Hsin-Chu (TW)

(72) Inventors: Chin-Liang Chen, Kaohsiung (TW); Yu-Chih Liu, Taipei (TW); Kuan-Lin Ho, Hsin-Chu (TW); Wei-Ting Lin, Taipei (TW); Shih-Yen Lin, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/297,899

(22) Filed: Jun. 6, 2014

(65) Prior Publication Data
US 2015/0357318 A1  Dec. 10, 2015

(51) Int. Cl.
*H01L 21/82* (2006.01)
*H01L 25/00* (2006.01)
(Continued)

(52) U.S. Cl.
CPC .............. *H01L 25/50* (2013.01); *H01L 24/14* (2013.01); *H01L 24/81* (2013.01); *H01L 24/97* (2013.01); *H01L 25/0657* (2013.01); *H01L 24/13* (2013.01); *H01L 24/16* (2013.01); *H01L 2224/0401* (2013.01);
(Continued)

(58) Field of Classification Search
None
See application file for complete search history.

(56) References Cited

U.S. PATENT DOCUMENTS 3,242,391 A * 3/1966 Gorman ..................... 257/772
4,878,611 A * 11/1989 LoVasco ............... H05K 3/303
228/180.22

(Continued)

OTHER PUBLICATIONS

Zhou et al. "An introduction to Eutectic Au/Sn Solder Alloy and Its Preforms in Microelectronics/Optoelectronic Packaging Applications," 2005, CNKI.com, total pp. 9.*

(Continued)

*Primary Examiner* — Kimberly Rizkallah
*Assistant Examiner* — Bo Bin Jang
(74) *Attorney, Agent, or Firm* — Slater Matsil, LLP

(57) ABSTRACT

Chip packages and methods of manufacture thereof are disclosed. In some embodiments, a method of manufacturing a chip package includes: stacking a second chip on a first chip, wherein a first interconnect including a support structure and a bonding structure is disposed between the first chip and the second chip; bonding the first chip and the second chip via a thermal process applied to the bonding structure of the first interconnect; stacking a third chip on the second chip, wherein a second interconnect including a support structure and a bonding structure is disposed between the second chip and the third chip; bonding the second chip and the third chip via the thermal process applied to the bonding structure of the second interconnect; and reflowing the bond between the first and second chips and simultaneously reflowing the bond between the second and third chips.

20 Claims, 12 Drawing Sheets

(51) Int. Cl.
*H01L 23/00* (2006.01)
*H01L 25/065* (2006.01)
*H01L 21/56* (2006.01)

(52) U.S. Cl.
CPC ........ *H01L 2224/05568* (2013.01); *H01L 2224/05571* (2013.01); *H01L 2224/06181* (2013.01); *H01L 2224/13023* (2013.01); *H01L 2224/13111* (2013.01); *H01L 2224/13147* (2013.01); *H01L 2224/1403* (2013.01); *H01L 2224/14181* (2013.01); *H01L 2224/16058* (2013.01); *H01L 2224/16148* (2013.01); *H01L 2224/16238* (2013.01); *H01L 2224/73204* (2013.01); *H01L 2224/8121* (2013.01); *H01L 2224/8123* (2013.01); *H01L 2224/81191* (2013.01); *H01L 2224/81193* (2013.01); *H01L 2224/81224* (2013.01); *H01L 2224/81815* (2013.01); *H01L 2224/81825* (2013.01); *H01L 2224/81907* (2013.01); *H01L 2224/81986* (2013.01); *H01L 2224/97* (2013.01); *H01L 2225/06513* (2013.01); *H01L 2225/06517* (2013.01); *H01L 2225/06568* (2013.01); *H01L 2924/15313* (2013.01)

(56) References Cited

U.S. PATENT DOCUMENTS

| 5,598,036 | A  | * | 1/1997 | Ho | 257/738 |
|---|---|---|---|---|---|
| 5,889,326 | A  | * | 3/1999 | Tanaka | 257/737 |
| 2004/0074950 | A1 | * | 4/2004 | Grieder | B23K 1/0016 228/180.22 |
| 2006/0235577 | A1 | * | 10/2006 | Ikeda | G11O 5/02 701/1 |
| 2007/0205788 | A1 | * | 9/2007 | Natsuhara et al. | 324/760 |
| 2009/0321948 | A1 | * | 12/2009 | Wang et al. | 257/777 |
| 2011/0215466 | A1 | * | 9/2011 | Hsu | H01L 23/544 257/737 |
| 2013/0037950 | A1 | * | 2/2013 | Yu et al. | 257/738 |
| 2013/0242520 | A1 | * | 9/2013 | Onozuka | B32B 5/02 361/783 |
| 2014/0273354 | A1 | * | 9/2014 | Ramaswami | H01L 21/52 438/126 |
| 2015/0055310 | A1 | * | 2/2015 | Viswanathan | B23K 1/20 361/774 |

OTHER PUBLICATIONS

Basaran et al. "Measuring intrinsic elastic modulus of Pb/Sn solder alloys," 2002, Mechanics of Materials, 34, pp. 349-362.*

* cited by examiner

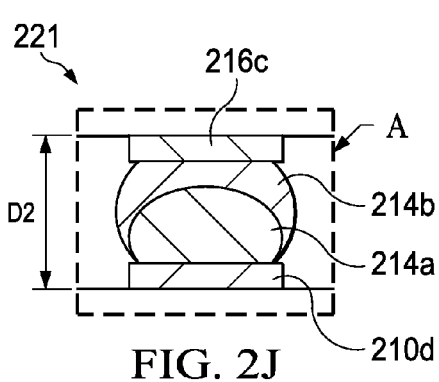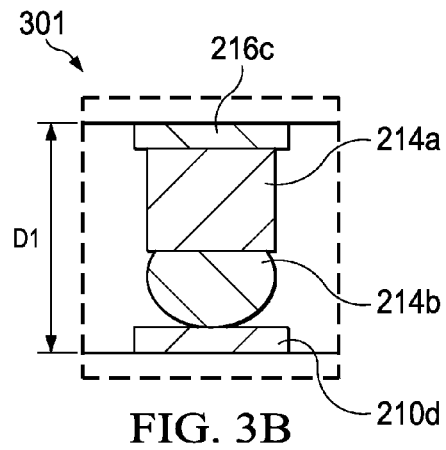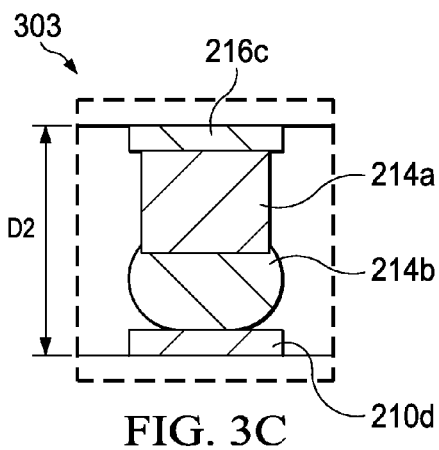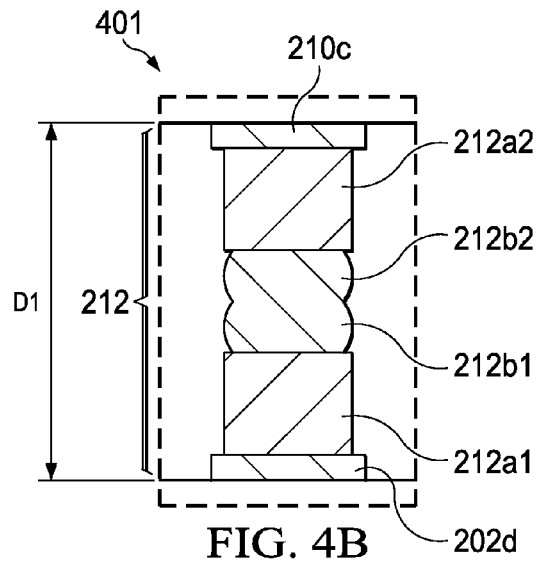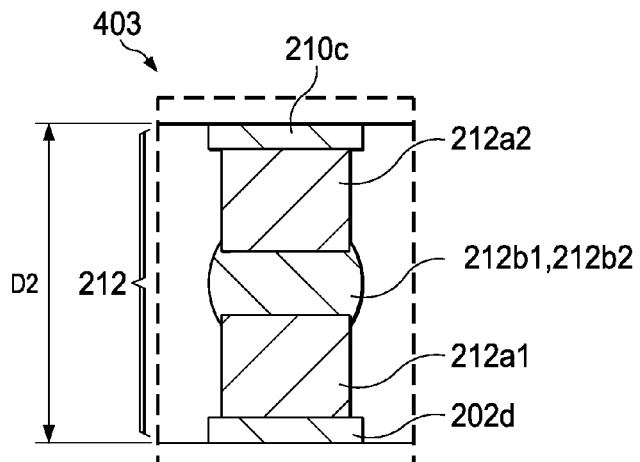

METHOD OF MANUFACTURING A CHIP PACKAGE

BACKGROUND

Since the invention of the integrated circuit, the semiconductor industry has experienced continued rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D integrated circuit formation, there are physical limits to the density that can be achieved in two dimensions. One of these limits is the minimum size needed to make these components. Also, when more devices are put into one chip, more complex designs are required. An additional limit comes from the significant increase in the number and length of interconnections between devices as the number of devices increases. When the number and length of interconnections increase, both circuit RC delay and power consumption increase.

Three-dimensional (3D) integrated circuits (ICs) help to resolve the above-discussed limitations. Technologies in 3D IC include wafer-on-wafer, die-on-wafer and die-on-die. In a typical formation process of wafer-on-wafer 3D IC, a plurality of wafers, each including an integrated circuit, are formed. The wafers are then bonded with the devices aligned. Much higher device density has been achieved using 3D IC technology. Accordingly, 3D IC technology has the potential of being the mainstream technology of the next generation.

For Die-on-Wafer technology, electronic components are built on two semiconductor wafers. One wafer is diced; and the singulated dies are aligned and bonded onto die sites of the second wafer. An advantageous feature of the die-to-wafer bonding is that the size of dies may be smaller than the size of chips on the wafer. During a typical die-to-wafer bonding process, spaces will be left between the dies. The spaces are typically filled with a coating, such as spin-on-glass. Thinning and through via (such as through-silicon via, or TSV) creation may be done before or after bonding, and additional dies may be added to the stacks before dicing. For die-on-die technology, electronic components are built on multiple dies, which are then aligned and bonded. Thinning and TSV creation may be done before or after bonding.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A to FIG. 2J show a process flow illustrating a method of manufacturing a chip package, in accordance with some embodiments.

FIG. 3B, FIG. 3C, FIG. 4B, and FIG. 4C show an interconnect between two chips, in accordance with some embodiments.

DETAILED DESCRIPTION

Figure 1:
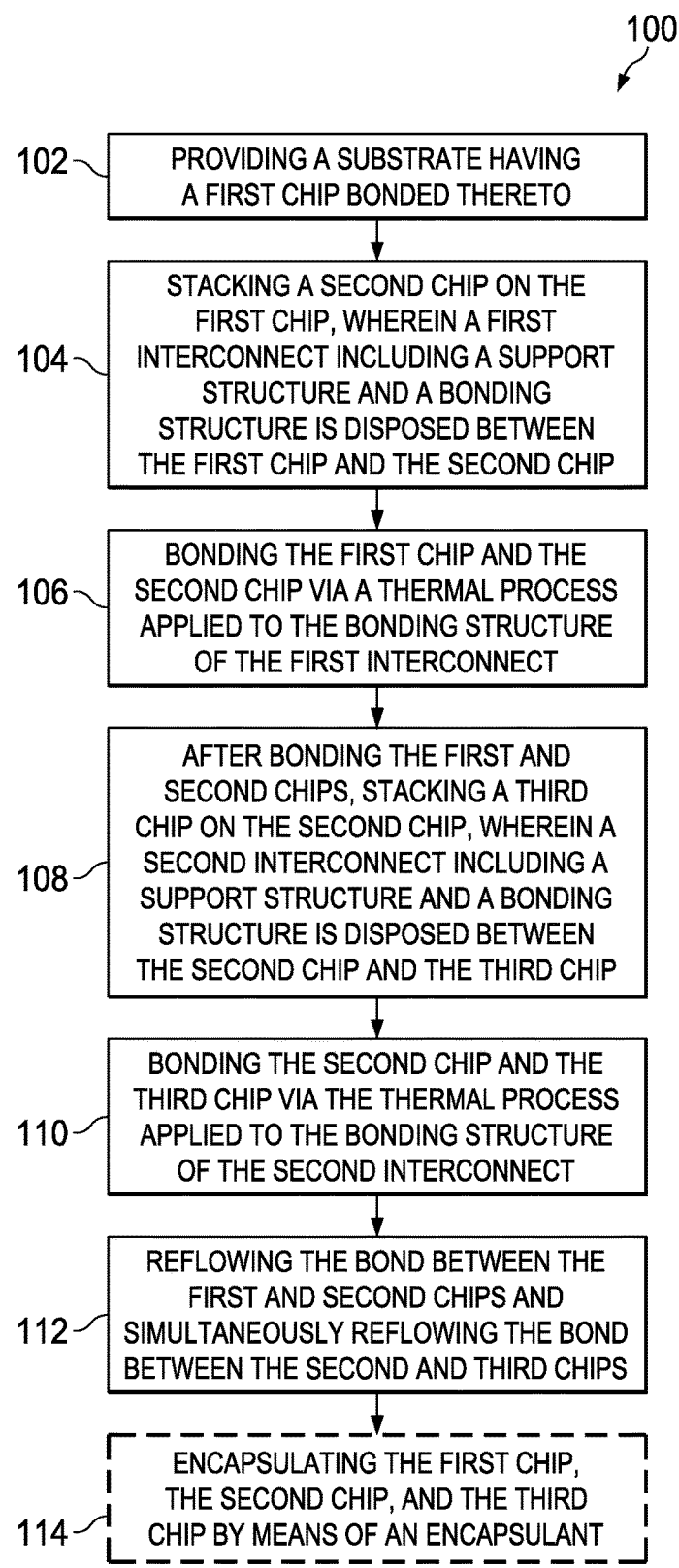
FIG. 1 shows a method of manufacturing a chip package, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 shows a method 100 of manufacturing a chip package, in accordance with some embodiments.

The method 100 may include: providing a substrate having a first chip bonded thereto (in 102); stacking a second chip on the first chip, wherein a first interconnect including a support structure and a bonding structure is disposed between the first chip and the second chip (in 104); bonding the first chip and the second chip via a thermal process applied to the bonding structure of the first interconnect (in 106); after bonding the first and second chips, stacking a third chip on the second chip, wherein a second interconnect including a support structure and a bonding structure is disposed between the second chip and the third chip (in 108); bonding the second chip and the third chip via the thermal process applied to the bonding structure of the second interconnect (in 110); and reflowing the bond between the first and second chips and simultaneously reflowing the bond between the second and third chips (in 112).

The method 100 may optionally include: encapsulating the first chip, the second chip, and the third chip by means of an encapsulant (in 114).

FIG. 2A to FIG. 2J show a process flow illustrating the method 100 of manufacturing a chip package, in accordance with one or more embodiments.

The process flow shown in FIG. 2A to FIG. 2J may, for example, be an intermediate stage of manufacture of a chip package. The description that follows describes the method 100 in the context of manufacturing a die-on-die 3D chip package. However, it may be noted that the method 100 may analogously be applied to the manufacture of other 3D chip packages, such as a wafer-on-wafer 3D chip package and a die-on-wafer 3D chip package.

Figure 2A:
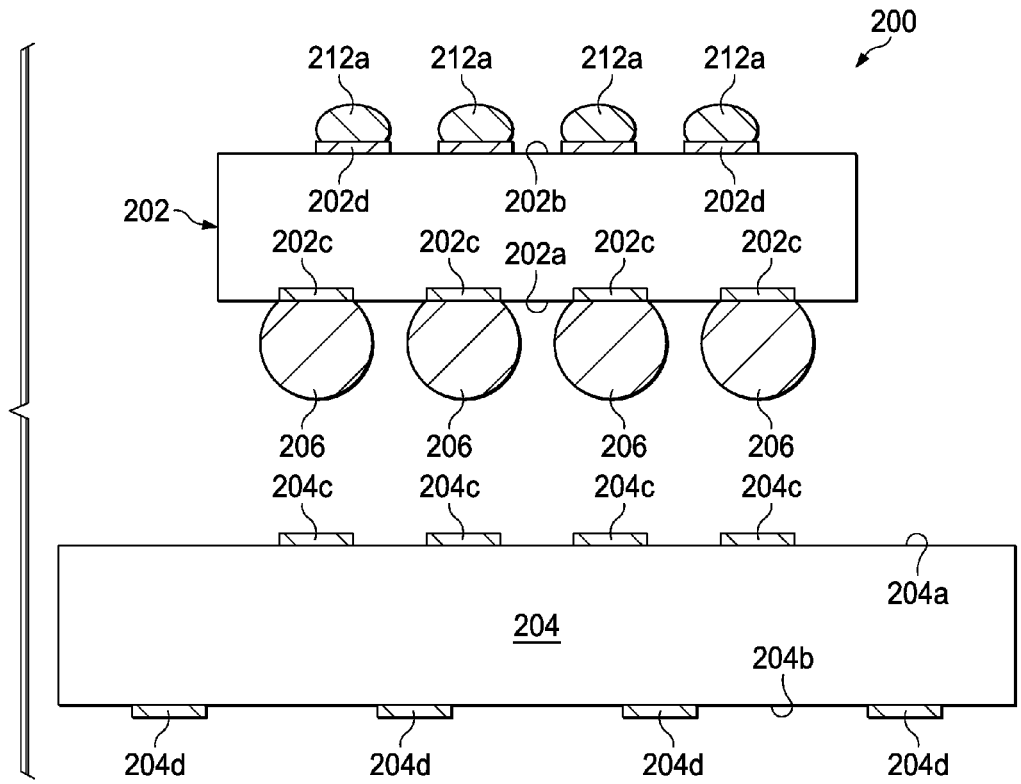

As shown in FIG. 2A in a view 200, a first chip 202 and a substrate 204 may be provided.

The first chip 202 may include, or may be, a chip (or die) that may have been singulated from a wafer including a plurality of chips. The first chip 202 may be used in one or more applications. For example, in an embodiment, the first chip 202 chip may be used in microelectromechanical systems (MEMS), logic, memory, power or communications applications, although other applications may be possible as well in accordance with other embodiments. As an example, in a logic and memory application, the first chip 202 may include, or may be, a logic chip.

The first chip 202 may have an active surface 202a and an inactive surface 202b opposite the active surface 202a. The first chip 202 may include a plurality of pads 202c formed at the active surface 202a. Only four pads 202c are shown as an example, however, the number of pads 202c may be less than four (e.g. one, two, or three) or may be more than four (e.g. five, six, seven, or more), in accordance with some embodiments.

The first chip 202 may additionally include a plurality of pads 202d formed at the inactive surface 202b. Only four pads 202d are shown as an example, however, the number of pads 202d may be less than four (e.g. one, two, or three) or may be more than four (e.g. five, six, seven, or more), in accordance with some embodiments.

In an embodiment, a thickness of the plurality of pads 202c and 202d may be in a range from about 3 μm to about 5 μm, although other thicknesses may be possible as well in accordance with other embodiments.

The plurality of pads 202c and 202d may include, or may consist of, an electrically conductive material (e.g. including copper or an alloy thereof). Methods of forming pads on a chip are known in the art and are not described here for the sake of brevity.

The substrate 204 may have a first side 204a and a second side 204b opposite the first side. The active surface 202a of the first chip 202 may face the first side 204a of the substrate 204, as shown in FIG. 2A.

The substrate 204 may include, or may be, at least one of a customer board, a printed circuit board, and an interposer board that may, for example, be used in an end-user application.

The substrate 204 may include, or may consist of, a laminate material, as an example. By way of another example, the substrate 204 may include, or may consist of, an epoxy polymer containing a filler material (e.g. glass fiber). By way of yet another example, the substrate 204 may include, or may consist of, FR4 and/or bis-maleimide triazine (BT). By way of a further example, the substrate 204 may include, or may consist of, an organic resin and/or a ceramic material.

In an embodiment, the substrate 204 may be formed by a lamination or pressing process, although other methods of forming the substrate 204 may be possible as well in accordance with other embodiments.

The substrate 204 may include a plurality of contacts 204c that may be formed at the first side 204a of the substrate 204. Only four contacts 204c are shown as an example, however, the number of contacts 204c may be less than four (e.g. one, two, or three) or may be more than four (e.g. five, six, seven, or more), in accordance with some embodiments.

The substrate 204 may additionally include a plurality of contacts 204d that may be formed at the second side 204b of the substrate 204. Only four contacts 204d are shown as an example, however, the number of contacts 204d may be less than four (e.g. one, two, or three) or may be more than four (e.g. five, six, seven, or more), in accordance with some embodiments.

The plurality of contacts 204c and 204d may include, or may consist of, an electrically conductive material (e.g. including copper or an alloy thereof). Methods of forming contacts on a substrate are known in the art and are not described here for the sake of brevity.

The substrate 204 may include a redistribution layer (RDL) (not shown in FIG. 2A), which may be partially or fully disposed within (e.g. partially or fully embedded within) the substrate 204. The RDL may redistribute and/or re-map electrical connections from the plurality of contacts 204c at the first side 204a of the substrate 204 to the plurality of contacts 204d at the second side 204b of the substrate 204.

The substrate 204 may include at least one circuit component (not shown in FIG. 2A) that may, for example, be embedded within the substrate 204. The at least one circuit component may include, or may be, a passive circuit component (e.g. a resistor, capacitor, inductor) and/or an active circuit component (e.g. a transistor or another chip).

As shown in FIG. 2A, a plurality of connectors 206 may be disposed at the active surface 202a of the first chip 202. More specifically, the plurality of connectors 206 may be disposed at (e.g. disposed on or over) the plurality of pads 202c at the active surface 202a of the first chip 202. However, in another embodiment, the plurality of connectors 206 may alternatively be disposed at (e.g. disposed on or over) the plurality of contacts 204c formed at the first side 204a of the substrate 204.

In the example shown in FIG. 2A, the plurality of connectors 206 have a spherical shape (e.g. balls). However, in another embodiment the plurality of connectors 206 may have another shape, e.g. pillars, posts, bumps, or caps.

As shown in FIG. 2A, support structures 212a may be disposed at (e.g. disposed on or over) the inactive surface 202b of the first chip 202. More specifically, a respective support structure 212a may be disposed at (e.g. disposed on or over) a respective pad 202d of the plurality of pads 202d. Only four support structures 212a are shown as an example, however, the number of support structures 212a may be less than four (e.g. one, two, or three) or may be more than four (e.g. five, six, seven, or more), in accordance with some embodiments.

In the example shown in FIG. 2A, the support structures 212a are shaped as bumps or caps. However, in another embodiment the support structures 212a may have another shape, e.g. pillars, posts, or the like (e.g. see description below in respect of FIG. 3A to FIG. 3C).

The plurality of connectors 206 and the support structures 212a may include, or may consist of, an electrically conductive material (e.g. a metal or metal alloy). For example, the plurality of connectors 206 and the support structures 212a may include, or may consist of, a solder material, although the solder material of the plurality of connectors 206 may be different from the solder material of the support structures 212a. By way of another example, the plurality of connectors 206 and the support structures 212a may include, or may consist of, at least one of tin, lead, copper, gold, silver, zinc, bismuth, magnesium, antimony, indium or an alloy thereof. For example, the support structures 212a may include, or may consist of, pure Sn, SnAg, SnCu, or SnCuAg.

The support structures 212a may not consist of copper. In other words, if copper is included in the support structures 212a, the copper may be included in an alloy having at least one other metal, e.g. tin, lead, gold, silver, zinc, bismuth, magnesium, antimony, and indium. However, in such an alloy, a relative concentration of copper may be lower than a relative concentration of any one of the above-mentioned materials. For example, in an embodiment where the support structures 212a include, or consist of, SnCu, the relative concentration of Cu may be lower than the relative concentration of Sn. By way of another example, in an embodiment where the support structures 212a includes, or consist of, SnCuAg, the relative concentration of Cu may be lower than the relative concentration of Sn and/or the relative concentration of Ag.

In an embodiment, the plurality of connectors 206 and/or the support structures 212a may be formed by at least one of a printing process (e.g. screen printing), a jetting process, a dispensing process, and an electro/electroless plating process, although other processes may be possible as well in accordance with other embodiments.

Figure 2B:
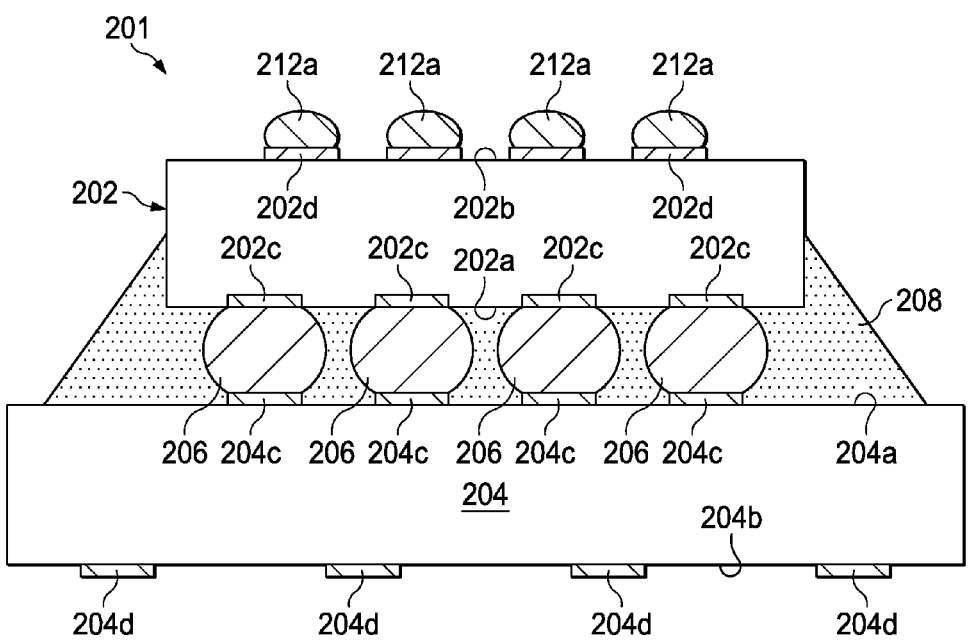

As shown in FIG. 2B in a view 201, the first chip 202 and the substrate 204 may subsequently be bonded to each other.

In the example shown in FIG. 2B, the first chip 202 may be flip-chip bonded to the substrate 204. Methods of flip-chip bonding a chip to a substrate are well-known in the art, and are not described here for the sake of brevity.

The chip package 100 may include an underfill layer 208 that may be disposed between the chip 202 and the substrate 204. The underfill layer 208 may enclose (e.g. surround or encapsulate) the plurality of connectors 206.

The underfill layer 208 may include, or may consist of, an insulating material, which may, for example, include at least one of an epoxy material, a polyurethane material and an epoxy blend including two or more epoxy materials. The underfill layer 208 may be filled with filler particles, such as silica filler, glass filler or similar fillers.

Figure 2C:
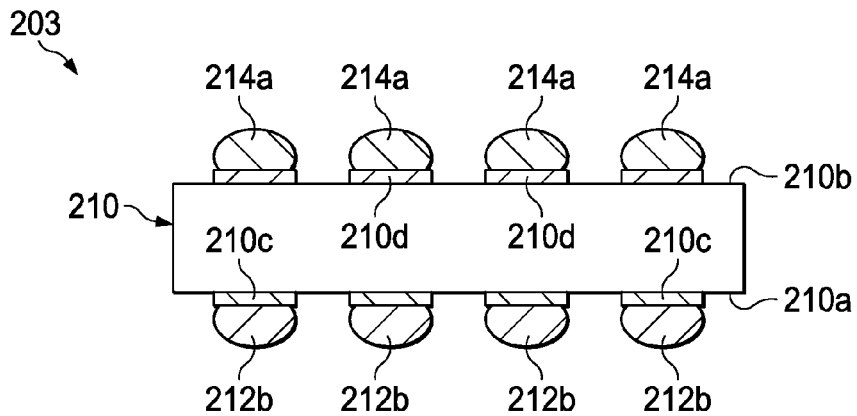

As shown in FIG. 2C in a view 203, a second chip 210 may be provided.

The second chip 210 may include, or may be, a chip (or die) that may have been singulated from a wafer including a plurality of chips. The second chip 210 may be used in one or more applications, such as the examples stated above in respect of the first chip 202. As an example, in a logic and memory application, the second chip 210 may include, or may be, a memory chip.

The second chip 210 may have a first surface 210a and a second surface 210b opposite the first surface 210a. The second chip 210 may include a plurality of pads 210c formed at, for example, the first surface 210a. The second chip 210 may additionally include a plurality of pads 210d formed at, for example, the second surface 210b. Only four pads 210d and only four pads 210c are shown as an example, however, the number of pads 210d and/or 210c may be less than four (e.g. one, two, or three) or more than four (e.g. five, six, seven, or more) in accordance with some embodiments.

In an embodiment, a thickness of the plurality of pads 210c and 210d may be in a range from about 3 μm to about 5 μm, although other thicknesses may be possible as well in accordance with other embodiments.

The plurality of pads 210c and 210d may include, or may consist of, an electrically conductive material (e.g. including copper or an alloy thereof). Methods of forming pads on a chip are known in the art and are not described here for the sake of brevity.

As shown in FIG. 2C, bonding structures 212b may be disposed at (e.g. disposed on or over) the first surface 210a of the second chip 210, and support structures 214a may be disposed at (e.g. disposed on or over) the second surface 210b of the second chip 210. More specifically, a respective bonding structure 212b may be disposed at (e.g. disposed on or over) a respective pad of the plurality of pads 210c, and a respective support structure 214a may be disposed at (e.g. disposed on or over) a respective pad of the plurality of pads 210d.

Only four bonding structures 212b and only four support structures 214a are shown as an example, however, the number of bonding structures 212b and/or support structures 214a may be less than four (e.g. one, two, or three) or more than four (e.g. five, six, seven, or more) in accordance with some embodiments.

In the example shown in FIG. 2C, the bonding structures 212b and the support structures 214a are shaped as bumps or caps. However, in another embodiment the bonding structures 212b and/or the support structures 214a may have another shape, e.g. pillars, posts, or the like (e.g. see description below in respect of FIG. 3A to FIG. 3C).

The bonding structures 212b and the support structures 214a may include, or may consist of, an electrically conductive material (e.g. a metal or metal alloy). For example, the bonding structures 212b and the support structures 214a may include, or may consist of, a solder material, although the solder material of the bonding structures 212b may be different from the solder material of the support structures 214a. By way of another example, the bonding structure 212b and the support structure 214a may include, or may consist of, at least one of tin, lead, copper, gold, silver, zinc, bismuth, magnesium, antimony, indium or an alloy thereof. For example, the bonding structures 212b may include, or may consist of, pure In, SnIn, SnBi, or InBiSn. By way of another example, the support structures 214a may include, or may consist of, pure Sn, SnAg, SnCu, or SnCuAg.

The support structures 214a may not consist of copper. In other words, if copper is included in the support structures 214a, the copper is included in an alloy having at least one other metal, e.g. tin, lead, gold, silver, zinc, bismuth, magnesium, antimony, and indium. However, in such an alloy, a relative concentration of copper may be lower than a relative concentration of any one of the above-mentioned materials. For example, in an embodiment where the support structure 214a includes, or consists of, SnCu, the relative concentration of Cu may be lower than the relative concentration of Sn. By way of another example, in an embodiment where the support structure 214a includes, or consists of, SnCuAg, the relative concentration of Cu may be lower than the relative concentration of Sn and/or the relative concentration of Ag.

In an embodiment, the bonding structures 212b and the support structures 214a may be formed by at least one of a printing process (e.g. screen printing), a jetting process, a dispensing process, and an electro/electroless plating process, although other processes may be possible as well in accordance with other embodiments.

Figure 2D:
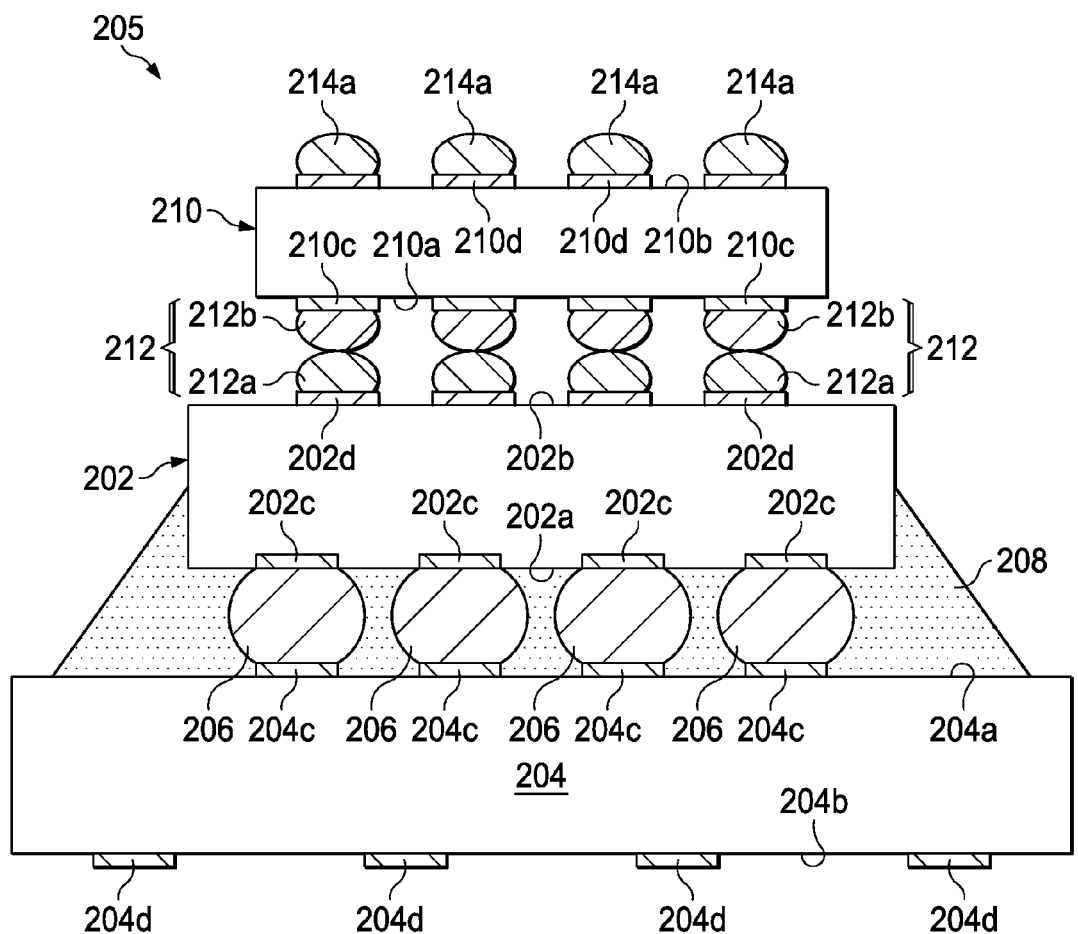

As shown in FIG. 2D in a view 205, the second chip 210 may be stacked on the first chip 202.

It is noted that at this stage of the process flow, the first chip 202 and the second chip 210 are not bonded to each other. FIG. 2D merely shows that the second chip 210 is placed on top of the first chip 202.

As shown in FIG. 2D, a respective bonding structure 212b and an underlying respective support structure 212a may form a first interconnect 212, which may be disposed between the first chip 202 and the second chip 210. In other words, a first interconnect 212 comprising a respective bonding structure 212b and a respective support structure 212a may be interposed between the first chip 202 and the second chip 210. The description that follows makes reference to only one first interconnect 212 comprising a respective bonding structure 212b and a respective support structure 212a. Similar references may be made to the other first interconnects 212 shown in FIG. 2D.

In the example shown in FIG. 2D, the bonding structure 212b of the first interconnect 212 is disposed proximate to the second chip 210, and the support structure 212a of the first interconnect 212 is disposed proximate to the first chip 202. However, in another embodiment, the positions may be exchanged. In other words, the bonding structure 212b of the first interconnect 212 may be disposed proximate to the first chip 202, and the support structure 212a of the first interconnect 212 may be disposed proximate to the second chip 202 (e.g. see description below in respect of FIG. 3A to FIG. 3C).

Figure 2E:
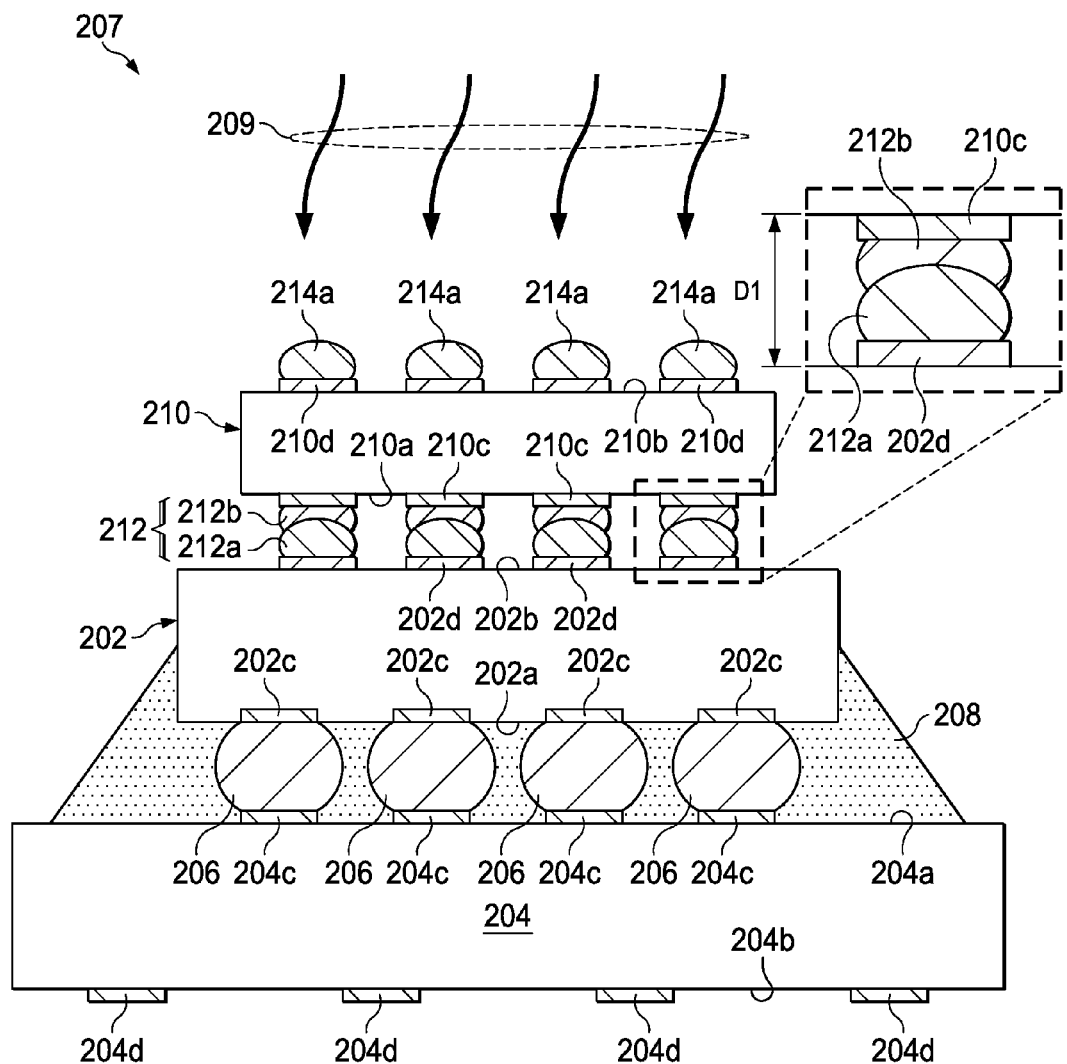

As shown in FIG. 2E in a view 207, the first chip 202 and the second chip 210 may be bonded to each other.

The bonding may be accomplished by means of a thermal process (indicated as arrows 209) that is applied to the bonding structure 212b of the first interconnect 212. In an embodiment, the thermal process 209 may include, or may be, a conduction process, although other heating processes may be possible as well in accordance with other embodiments. For example, the thermal process 209 may additionally, or alternatively, include at least one of convection heating, laser heating, radio-frequency (RF) heating, and infrared heating.

The thermal process 209 may soften the bonding structure 212b of the first interconnect 212, while leaving the support structure 212a of the first interconnect 212 and the support structure 214a disposed at the second surface 210b of the second chip 210 unperturbed and/or structurally intact. For example, the thermal process 209 (e.g. conduction process) may result in a solid-liquid interaction between the bonding structure 212b (in a liquid phase) and the support structure 212a (in a solid phase). In other words, the thermal process 209 (e.g. conduction process) may cause the liquid-phase bonding structure 212b to adhere to a portion of the solid-phase support structure 212a. Stated in yet another way, the liquid-phase bonding structure 212b may wet a surface of the solid-phase support structure 212a, and may spread over a given surface area.

The ability of the thermal process 209 to soften the bonding structure 212b of the first interconnect 212, while leaving the support structures 212a and 214a unperturbed and/or structurally intact may be a consequence of a difference in composition of the bonding structure 212b and the support structures 212a and 214a. In other words, the material comprised in the bonding structure 212b may be different from the material comprised in the support structures 212a and 214a. For example, the bonding structure 212b of the first interconnect 212 may include, or may consist of, a first solder material, while the support structure 212a of the first interconnect 212 may include, or may consist of, a second solder material different from the first solder material.

The difference in composition may result in a difference in a melting point of the bonding structure 212b and melting points of the support structures 212a and 214a.

The melting point of the bonding structure 212b may be lower than the melting point of the support structure 212a. Similarly, the melting point of the bonding structure 212b may be lower than the melting point of the support structure 214a.

The melting point of the bonding structure 212b may be in a range from about 50° C. to about 160° C. The melting point of either one, or both, of the support structures 212a and 214a may be in a range from about 220° C. to about 260° C.

A difference between the melting point of the support structure 212a (or the melting point of the support structure 214a) and the melting point of the bonding structure 212b may be greater than or equal to about 100° C. As described above, a composition of the support structures 212a and 214a may not consist of copper (which has a melting point in the range from about 1000° C. to about 1100° C.), but may include an alloy thereof, where a relative concentration of copper is lower than a relative concentration of at least one other metal in the alloy. This may have an effect of reducing the melting point of the support structures 212a and 214a to a temperature lower than the melting point of copper. The difference between the melting points of the bonding structure 212b and the support structure 212a may be less than or equal to about 500° C. Accordingly, the difference between the melting point of the support structure 212a and the melting point of the bonding structure 212b may be in a range from about 100° C. to about 500° C.

A temperature of the thermal process 209 may be sufficient to merely soften the bonding structure 212b, but may not be high enough to melt the support structure 212a or the support structure 214a. For example, the temperature of the thermal process 209 may be sufficient to result in the above-described solid-liquid interaction between the bonding structure 212b (in a liquid phase) and the support structure 212a (in a solid phase). For example, the temperature of the thermal process 209 may be within about 5° C. to about 10° C. of the melting point of the bonding structure 212b. For example, in an embodiment, the temperature of the thermal process 209 may be in a range from about 40° C. to about 155° C., although other temperatures sufficient to merely soften the bonding structure 212b may be possible as well in accordance with other embodiments.

Besides differing in composition and melting points, the bonding structure 212b may differ from the support structures 212a and 214a in terms of elasticity or softness.

The softness of a material may be quantified by an elastic modulus (which may also be referred to as a Young's modulus). In an embodiment, the bonding structure 212b may be softer than the support structure 212a and/or the support structure 214a. In other words, the bonding structure 212b may have a first elastic modulus, and the support structure 212a and/or the support structure 214a may have a second elastic modulus, which may be greater than the first elastic modulus. For example, the bonding structure 212b may include, or may consist of, a first solder material, and the support structure 212a may include, or may consist of, a second solder material different from the first solder material. The first solder material may have a first elastic modulus, and the second solder material may have a second elastic modulus greater than the first elastic modulus. By way of another example, the support structure 212a of the first interconnect 212 may include, or may be, a hard solder layer (shaped as a bump), and the bonding structure 212b of the first interconnect 212 may include, or may be, a soft solder layer (shaped as a bump).

The first elastic modulus may be in a range from about 5 GPa to about 20 GPa, while the second elastic modulus may be in a range from about 20 GPa to about 40 GPa. It is noted that the first elastic modulus and the second elastic modulus may be less than the elastic modulus of copper (which may be in a range from about 40 GPa to about 50 GPa, e.g. about 48 GPa).

Figure 2F:
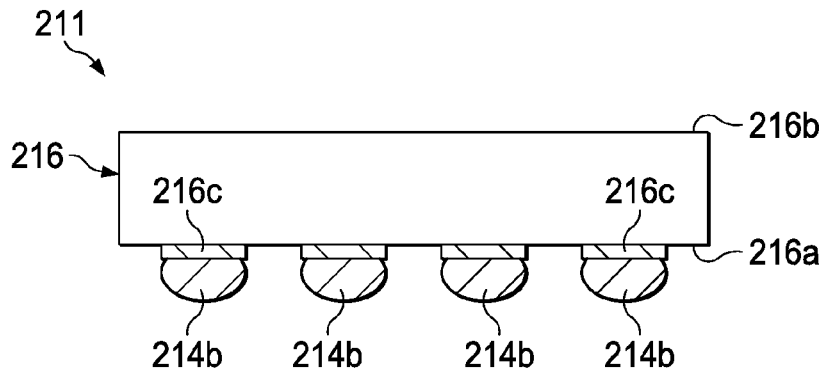

The first chip 202 and the second chip 210 may be separated by a first distance D1 after the thermal process 209, which may be measured from the inactive surface 202b of the first chip 202 and the first surface 210a of the second chip 210. In an embodiment, the first distance D1 may be in a range from about 20 μm to about 50 μm, although other distances may be possible as well in accordance with other embodiments As shown in FIG. 2F in a view 211, a third chip 216 may be provided.

The third chip 216 may include, or may be, a chip (or die) that may have been singulated from a wafer including a plurality of chips. The third chip 216 may be used in one or more applications, such as the examples stated above in respect of the second chip 210. As an example, in a logic and memory application, the third chip 216 may include, or may be, a memory chip.

The third chip 216 may have a first surface 216a and a second surface 216b opposite the first surface 216a. The third chip 216 may include a plurality of pads 216c formed at the first surface 216a. Only four pads 216c are shown as an example, however, the number of pads 216c may be less than four (e.g. one, two, or three) or may be more than four (e.g. five, six, seven, or more), in accordance with some embodiments.

In an embodiment, a thickness of the plurality of pads 216c may be in a range from about 3 μm to about 5 μm, although other thicknesses may be possible as well in accordance with other embodiments.

The plurality of pads 216c may include, or may consist of, an electrically conductive material (e.g. including copper or an alloy thereof). Methods of forming pads on a chip are known in the art and are not described here for the sake of brevity.

As shown in FIG. 2F, bonding structures 214b may be disposed at (e.g. disposed on or over) the first surface 216a of the third chip 216. More specifically, a respective bonding structure 214b may be disposed at (e.g. disposed on or over) a respective pad of the plurality of pads 216c. Only four bonding structures 214b are shown as an example, however, the number of bonding structures 214b may be less than four (e.g. one, two, or three) or more than four (e.g. five, six, seven, or more) in accordance with some embodiments.

In the example shown in FIG. 2F, the bonding structures 214b are shaped as bumps or caps. However, in another embodiment the bonding structures 214b may have another shape, e.g. pillar, post, or the like (e.g. see description below in respect of FIG. 3A to FIG. 3C).

The bonding structures 214b may include, or may consist, of similar materials described above in respect of the bonding structures 212b. Similarly, the bonding structures 214b may be formed using similar methods described above in respect of bonding structures 212b. Reference is made to the description above for the sake of brevity.

Figure 2G:
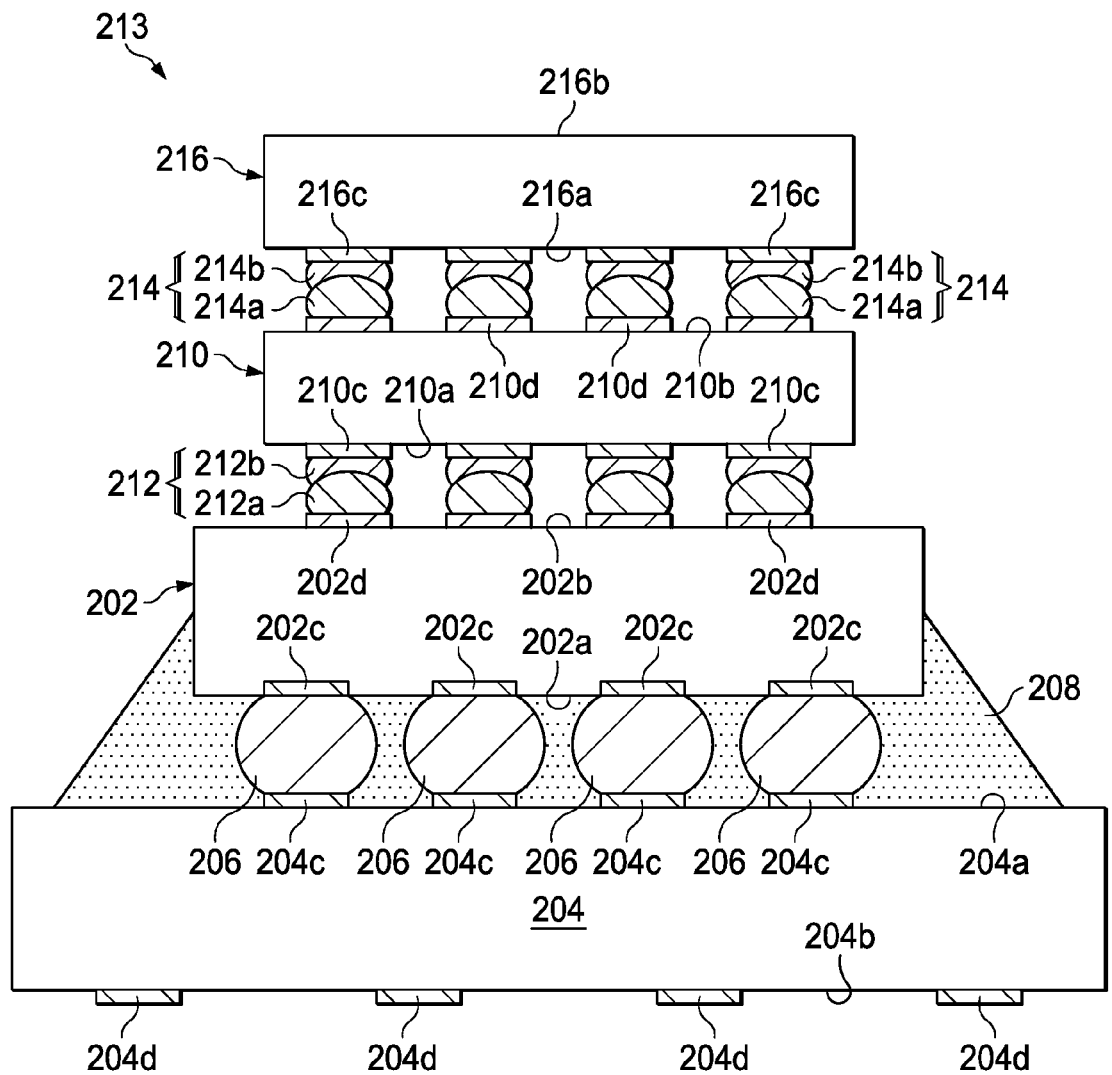

As shown in FIG. 2G in a view 213, the third chip 216 may be stacked on the second chip 210 of the chip arrangement shown in FIG. 2E.

It is noted that at this stage of the process flow, the third chip 216 and the second chip 210 are not bonded to each other. FIG. 2G merely shows that the third chip 216 is placed on top of the second chip 210.

As shown in FIG. 2G, a respective bonding structure 214b and an underlying respective support structure 214a may form a second interconnect 214, which may be disposed between the second chip 210 and the third chip 216. In other words, a second interconnect 214 comprising a respective bonding structure 214b and a respective support structure 214a may be interposed between the second chip 210 and the third chip 216. The description that follows makes reference to only one second interconnect 214 comprising a respective bonding structure 214b and a respective support structure 214a. Similar references may be made to the other second interconnects 214 shown in FIG. 2G.

In the example shown in FIG. 2G, the bonding structure 214b of the second interconnect 214 is disposed proximate to the third chip 216, and the support structure 214a of the second interconnect 214 is disposed proximate to the second chip 210. However, in another embodiment, the positions may be exchanged. In other words, the bonding structure 214b may be disposed proximate to the second chip 210, and the support structure 214a may be disposed proximate to the third chip 202 (e.g. see description below in respect of FIG. 3A to FIG. 3C).

Figure 2H:
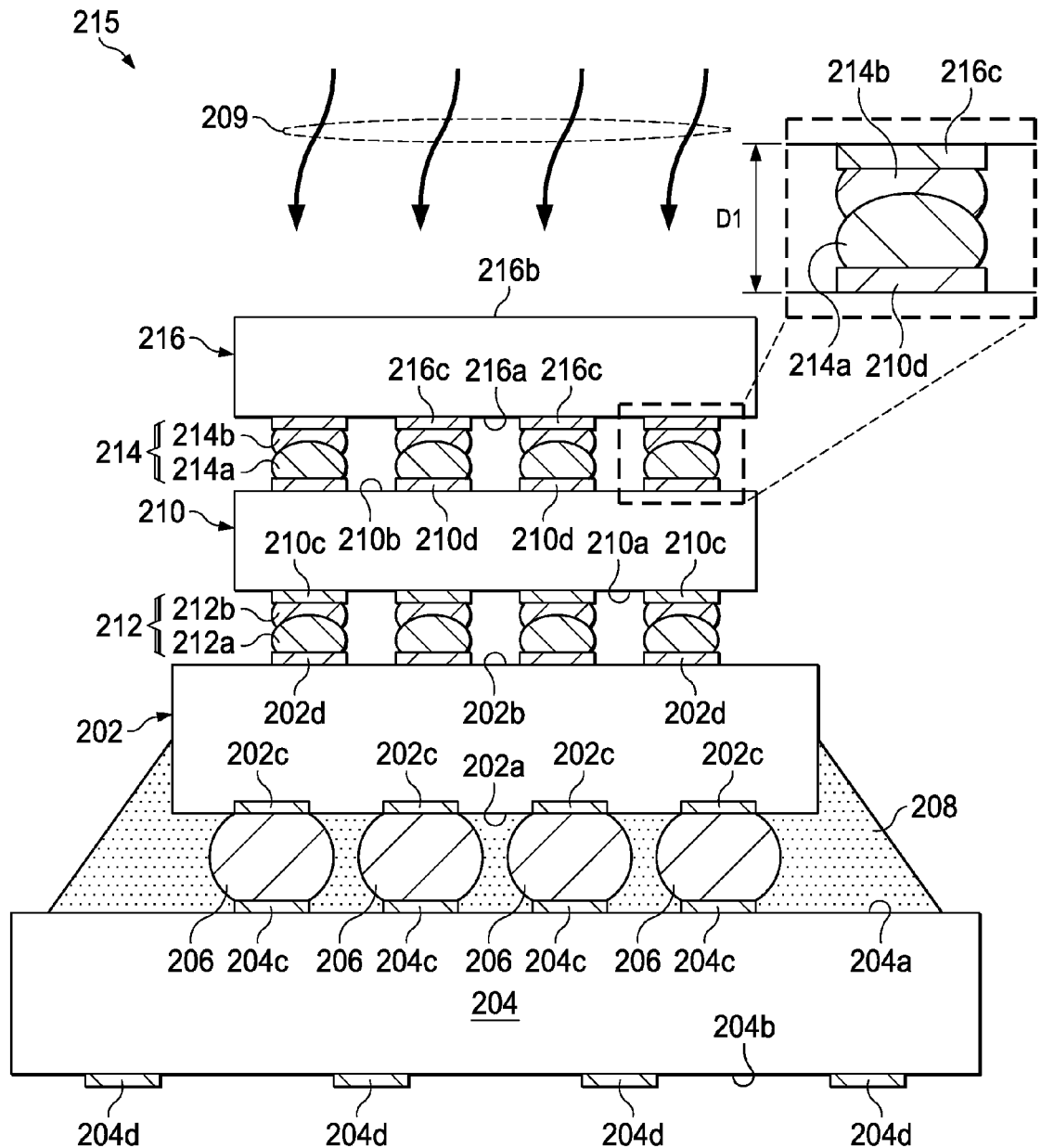

As shown in FIG. 2H in a view 215, the second chip 210 and the third chip 216 may be bonded to each other.

The bonding may be accomplished by means of the thermal process 209 described above. Features of the thermal process 209 (e.g. temperature ranges, thermal mechanism of the process 209, etc.) have been described above, and reference is made to the description above for the sake of brevity.

Similar to the bonding described in respect of FIG. 2E, the thermal process 209 may soften the bonding structure 214b of the second interconnect 214, while leaving the support structure 214a of the second interconnect 214 unperturbed and/or structurally intact. For example, the thermal process 209 (e.g. conduction process) may result in a solid-liquid interaction between the bonding structure 214b (in a liquid phase) and the support structure 214a (in a solid phase). Stated in yet another way, the liquid-phase bonding structure 214b may wet a surface of the solid-phase support structure 214a, and may spread over a given surface area.

The second chip 210 and the third chip 216 may be separated by a first distance D1 after the thermal process 209. The first distance D1 may be measured between the second surface 210b of the second chip 210 and the first surface 216a of the third chip 216. Values of the first distance D1 have been described above, and reference is made to the description above for the sake of brevity.

The ability of the thermal process 209 to soften the bonding structure 214b of the second interconnect 214, while leaving the support structure 214a unperturbed and/or structurally intact may be a consequence of a difference in composition of the bonding structure 214b and the support structure 214a. In other words, the material comprised in the bonding structure 214b may be different from the material comprised in the support structure 214a. For example, the bonding structure 214b of the second interconnect 214 may include, or may consist of, a first solder material, while the support structure 214a of the second interconnect 214 may include, or may consist of, a second solder material different from the first solder material.

The difference in composition may result in a difference in a melting point of the bonding structure 214b and melting point of the support structure 214a.

The melting point of the bonding structure 214b may be lower than the melting point of the support structure 214a. The melting point of the bonding structure 214b may be in a similar range of values described above in respect of the bonding structure 212b. Reference is made to the description above for the sake of brevity.

As described above, the temperature of the thermal process 209 may be sufficient to merely soften the bonding structure 214b, but may not be high enough to melt the support structure 214a. For example, the temperature of the thermal process 209 may be just sufficient to result in the above-described solid-liquid interaction between the bonding structure 214b (in a liquid phase) and the support structure 214a (in a solid phase). A range of temperatures of the thermal process 209 has been described above in respect of FIG. 2E. Reference is made to the description above for the sake of brevity.

Besides differing in composition and melting points, the bonding structure 214b may differ from the support structure 214a in terms of elasticity or softness. In an embodiment, the bonding structure 214b may be softer than the support structure 214a. In other words, the bonding structure 214b may have a first elastic modulus, and the support structure 214a may have a second elastic modulus, which may be greater than the first elastic modulus. For example, the bonding structure 214b may include, or may consist of, a first solder material, and the support structure 214a may include, or may consist of, a second solder material different from the first solder material. The first solder material may have a first elastic modulus, and the second solder material may have a second elastic modulus greater than the first elastic modulus. By way of another example, the support structure 214a of the second interconnect 214 may include, or may be, a hard solder layer (shaped as a bump), and the bonding structure 214b of the second interconnect 212 may include, or may be, a soft solder layer (shaped as a bump).

The ranges of the first and second elastic moduli have been described above, and reference is made to the description above for the sake of brevity.

Figure 2I:
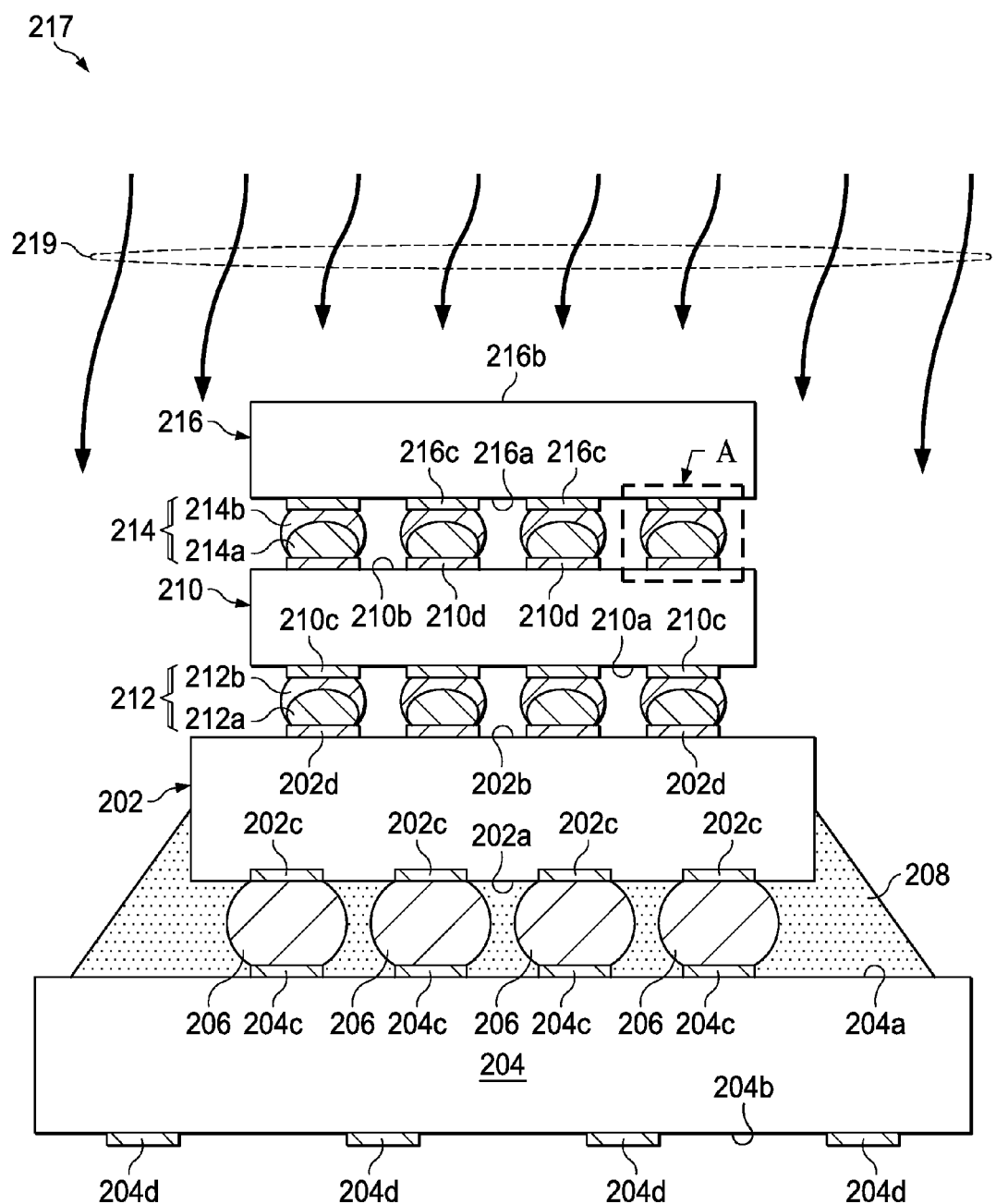

As shown in FIG. 2I in a view 217, a reflow process (indicated as arrows 219) is applied to the bond between the first and second chips 202, 210 and the bond between the second and third chips 210, 216.

In particular, the bond between the first and second chips 202, 210 is reflowed by means of the reflow process 219. The bond between the second and third chips 210, 216 is simultaneously reflowed by means of the reflow process 219.

In an embodiment, the reflow process 219 may be a convection heating process, although other heating processes may be possible as well in accordance with other embodiments. For example, the reflow process 219 may additionally, or alternatively, include at least one of laser heating, RF heating, and infrared heating.

A temperature of the reflow process 219 may be in a range of about 20° C. to about 30° C. higher than the melting temperature of the bonding structure 212b of the first interconnect 212 and the melting temperature of the bonding structure 214b of the second interconnect 214. For example, a temperature of the reflowing (i.e. of the reflow process 219) may be in a range from about 70° C. to about 190° C.

As described above in respect of the thermal process 209, the temperature of the thermal process 209 may be just sufficient to soften the bonding structures 212b and 214b, but may not be high enough to melt the support structures 212a and 214a. With regards to the reflow process 219, the temperature of the reflow process 219 may melt the bonding structures 212b and 214b, but may not be high enough to melt the support structures 212a and 214a. In an embodiment, the temperature of the reflow process 219 may be higher than the temperature of the thermal process 209.

As described above, the reflow process 219 may melt the bonding structures 212b and 214b, while leaving the support structures 212a and 214a unperturbed and/or structurally intact. For example, the reflow process 219 may result in a solid-liquid interaction between a respective bonding structure of the bonding structures 212b, 214b (in a liquid phase) and its corresponding support structure 212a, 214a (in a solid phase). In other words, the liquid-phase bonding structures 212b, 214b may wet a surface of the solid-phase support structures 212a, 214a and may spread over a given surface area.

The surface areas of the support structures 212a, 214a covered by the bonding structures 212b, 214b as a consequence of the reflow process 219 may be greater than the surface areas of the support structures 212a, 214a covered by the bonding structures 212b, 214b as a consequence of the thermal process 209. This is illustrated in FIG. 2J, which shows an enlarged view 221 of the box A shown in FIG. 2I.

The second chip 210 and the third chip 216 may be separated by a second distance D2 after the reflow process 219. In like manner the first chip 202 and the second chip 210 may be separated by the second distance D2 after the reflow process 219.

The second distance D2 may be measured between the second surface 210b of the second chip 210 and the first surface 216a of the third chip 216. In an embodiment, the second distance D2 may be smaller than the first distance D1 (e.g. shown in FIG. 2H). In an embodiment, the second distance D2 may be in a range from about 10 μm to about 40 μm, although other distances may be possible as well in accordance with other embodiments.

In a conventional chip package process, the reflow process 219 may be performed multiple times, e.g. every time a chip is stacked on another, e.g. to bond the chip to the underlying chip. This may result in an increased thermal budget.

In comparison, the process flow described in FIG. 2A to FIG. 2J applies a lower-temperature thermal process 209 to the bonding structures of the interconnects, (which comprise a material having a low melting point) every time a chip is stacked on another. Furthermore, the reflow process 219 is performed once and simultaneously reflows all the bonds between various chips. Consequently, an effect provided by the process flow described in FIG. 2A to FIG. 2J may be that the total thermal budget of the described process flow is lower than that of a conventional chip package process. This may consequently reduce at least one of yield loss, warpage, and reliability risks of a chip package manufactured by means of the process flow shown in FIG. 2A to FIG. 2J.

Furthermore, application of a lower-temperature thermal process 209 to the bonding structures of the interconnects, (which comprise a material having a low melting point) every time a chip is stacked on another (as opposed to a high temperature reflow process) may allow stacking re-workability. For example, a bond between one chip and another chip underlying it can be re-worked, e.g. in case of alignment issues during stacking.

Even further, the support structures of the interconnects may comprise a solder material (e.g. having a higher melting point and/or a higher elastic modulus), and the bonding structures of the interconnects may comprise another solder material (e.g. having a lower melting point and/or a lower elastic modulus). This may provide a soft solder post between chips. Consequently, this may reduce or prevent low-k delamination of the interconnects, e.g. during the reflow process 219 and/or at a later stage.

Figure 3A:
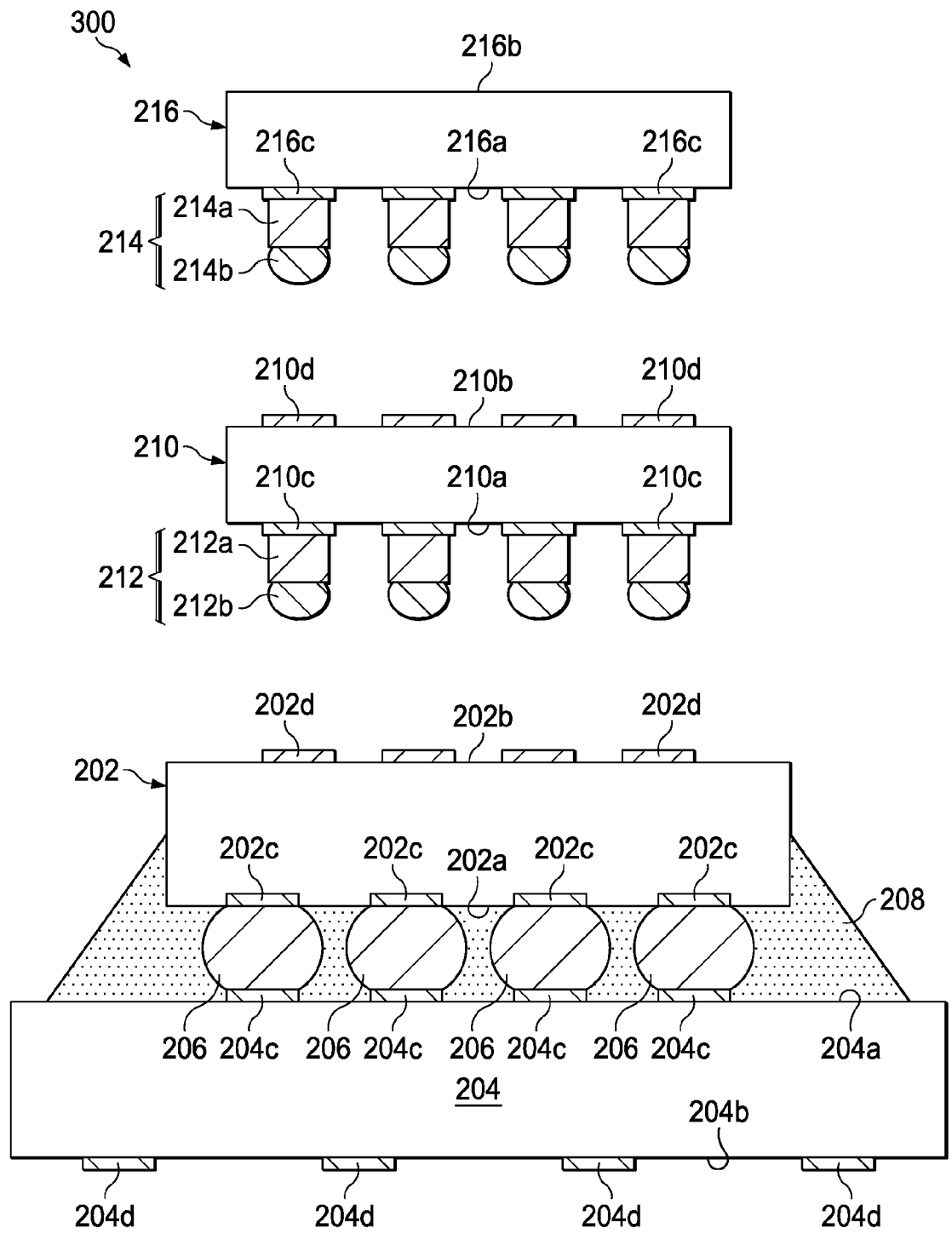
FIG. 3A and FIG. 4A shows a first chip, a second chip, and a third chip, in accordance with some embodiments.

FIG. 3A shows a view 300 of the first chip 202, the second chip 210, and the third chip 216, in accordance with an embodiment.

Reference signs in FIG. 3A that are the same as in FIG. 2A to FIG. 2J denote the same or similar elements. Thus, those elements will not be described in detail again here; reference is made to the description above. Differences between FIG. 3A and FIGS. 2A to 2J are described below.

As shown in FIG. 3A, the inactive surface 202b of the first chip 202 may be devoid of the bonding structure 212b. Instead, the bonding structure 212b of the first interconnect 212 may be disposed over the support structure 212a of the first interconnect 212, which may in turn be disposed over a pad of the plurality of pads 210c of the second chip 210.

The support structure 212a of the first interconnect 212 shown in FIG. 3A is shaped as a post or a pillar, while the bonding structure 212b is shaped as a bump or a cap that is disposed over the post or pillar 212a. For example, the support structure 212a of the first interconnect 212 may include, or may be, a hard solder layer (shaped as a pillar), and the bonding structure 212b of the first interconnect 212 may include, or may be, a soft solder layer (shaped as a bump).

In the embodiment shown in FIG. 3A, the second surface 210b of the second chip 210 may be devoid of the bonding structure 214b. Instead, the bonding structure 214b of the second interconnect 214 may be disposed over the support structure 214a of the second interconnect 212, which may in turn be disposed over a pad of the plurality of pads 216c of the third chip 216.

The support structure 214a of the second interconnect 214 shown in FIG. 3A is shaped as a post or a pillar, while the bonding structure 214b is shaped as a bump or a cap that is disposed over the post or pillar 214a. For example, the support structure 214a of the second interconnect 214 may include, or may be, a hard solder layer (shaped as a pillar), and the bonding structure 214b of the second interconnect 214 may include, or may be, a soft solder layer (shaped as a bump).

Following the provision of the first chip 202, the second chip 210, and the third chip 216 shown in FIG. 3A, a chip package may be manufactured in accordance with the process flow described above in respect of FIG. 2A to FIG. 2J.

For example, the second chip 210 may be stacked on the first chip 202. Thereafter, the first and second chips 202 and 210 may be bonded to each other via the thermal process 209. After bonding the first and second chips 202 and 210, the third chip 216 may be stacked on the second chip 210. Thereafter, the second and third chips 210 and 216 may be bonded to each other via the thermal process 209.

FIG. 3B shows a view 301 of the second interconnect 214 disposed between the second and third chips 210 and 216 after the thermal process 209. As shown in FIG. 3B, the bonding structure 214b may wet a portion of the support structure 214a, and the second and third chips 210 and 216 may be separated by the first distance D1.

Following the bonding of the second and third chips 210 and 216 to each other, the reflow process 219 may be performed. The process 219 may reflow the bond between the first and second chips 202 and 210, and may simultaneously reflow the bond between the second and third chips 210 and 216. FIG. 3C shows a view 303 of the second interconnect 214 disposed between the second and third chips 210 and 216, e.g. after the reflow process 219. As shown in FIG. 3C, the bonding structure 214b may wet a larger portion of the support structure 214a, and the second and third chips 210 and 216 may be separated by the second distance D2, which may be less than the first distance D1.

The various advantageous effects described above in relation to FIG. 2A to FIG. 2J are also applicable to the embodiments shown in FIG. 3A to FIG. 3C.

Figure 4A:
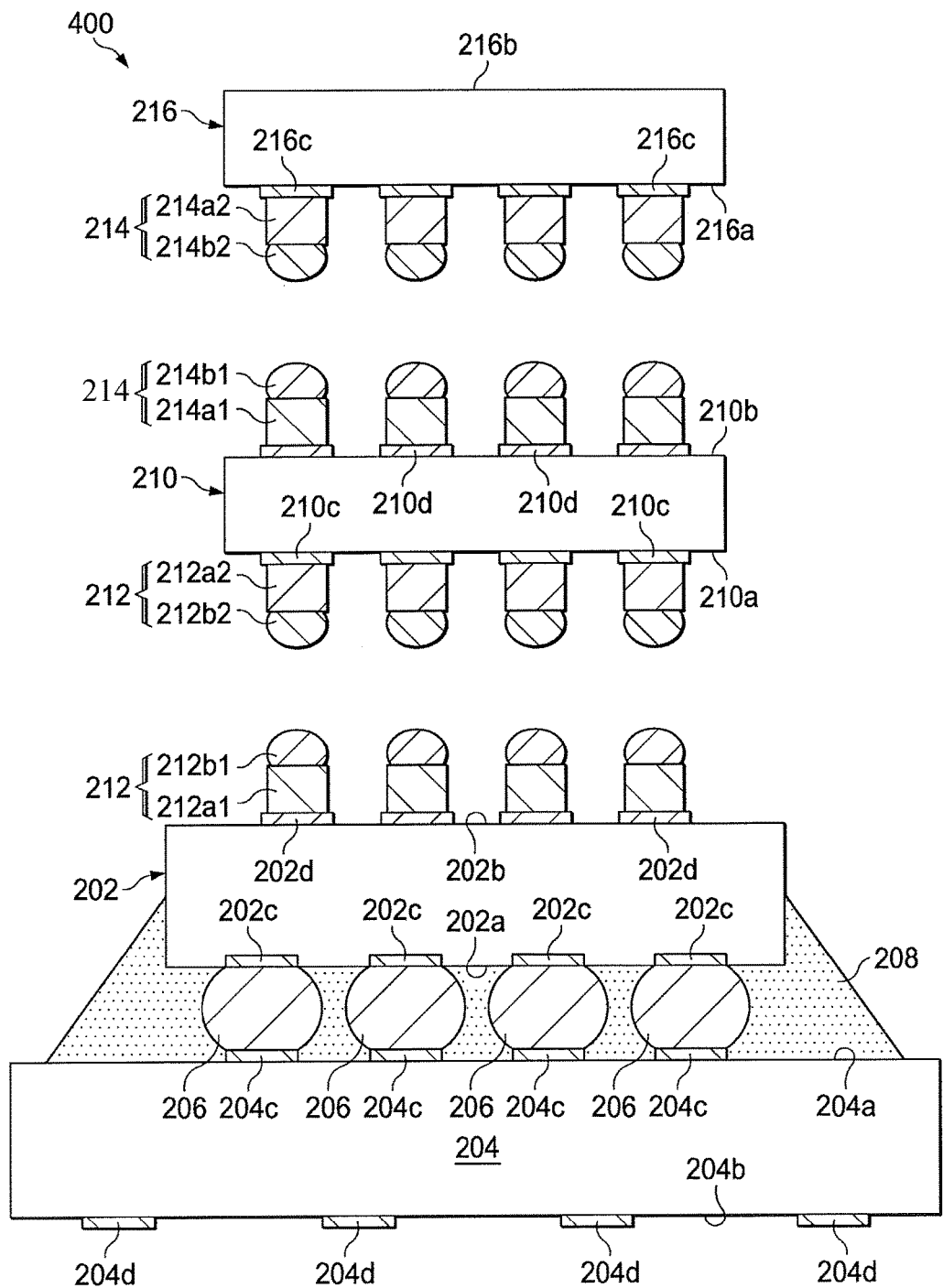

FIG. 4A shows a view 400 of the first chip 202, the second chip 210, and the third chip 216, in accordance with an embodiment.

Reference signs in FIG. 4A that are the same as in FIG. 2A to FIG. 2J denote the same or similar elements. Thus, those elements will not be described in detail again here; reference is made to the description above. Differences between FIG. 4A and FIGS. 2A to 2J are described below.

As shown in FIG. 4A, the first chip 202 may be provided. A first support sub-structure 212a1 may be formed at the inactive surface 202b of the first chip 202 and a first bonding sub-structure 212b1 may be formed over the first support sub-structure 212a1.

As shown in FIG. 4A, the second chip 210 may be provided. A second support sub-structure 212a2 may be formed at the first surface 210a of the second chip 210 and a second bonding sub-structure 212b2 may be formed over the second support sub-structure 212a2.

Following the provision of the first chip 202 and the second chip 210, the second chip 210 may be stacked on the first chip 202. FIG. 4B shows a view 401 of the first interconnect 212 disposed between the first chip 202 and the second chip 210, e.g. after stacking the second chip 210 on the first chip 202.

As shown in FIG. 4B, the first interconnect 212 includes the first and second support sub-structures 212a1, 212a2 and the first and second bonding sub-structures 212b1, 212b2. The first and second support sub-structures 212a1, 212a2 may be disposed proximate to the contact pad 202d of the first chip 202 and the contact pad 210c of the second chip 210. Furthermore, the first and second bonding sub-structures 212b1, 212b2 may be disposed between the first and second support sub-structures 212a1, 212a2, as shown in FIG. 4B.

Thereafter, the first and second chips 202 and 210 may be bonded to each other via the thermal process 209. FIG. 4B shows a view 401 of the first interconnect 212 disposed between the first and second chips 202 and 210 after the thermal process 209. As shown in FIG. 4B, the first and second bonding sub-structures 212b1, 212b2 may meld together, and the first and second chips 202 and 210 may be separated by the first distance D1.

After bonding the first and second chips 202 and 210, the third chip 216 may be stacked on the second chip 210. Thereafter, the second and third chips 210 and 216 may be bonded to each other via the thermal process 209.

As shown in FIG. 4A, a first support sub-structure 214a1 may be formed at the second surface 210b of the second chip 210 and a first bonding sub-structure 214b1 may be formed over the first support sub-structure 214a1. In like manner, a second support sub-structure 214a2 may be formed at the first surface 216a of the third chip 216 and a second bonding sub-structure 214b2 may be formed over the second support sub-structure 214a2.

The first and second bonding sub-structures 214b1, 214b2, and the first and second support sub-structures 214a1, 214a2 may, for example, be parts of the subsequently formed second interconnect 214. For example, the second interconnect 214 may include the first and second support sub-structures 214a1, 214a2 and the first and second bonding sub-structures 214b1, 214b2. The first and second support sub-structures 214a1, 214a2 may be disposed proximate to the contact pad 210d of the second chip 210 and the contact pad 216c of the third chip 216. Furthermore, the first and second bonding sub-structures 214b1, 214b2 may be disposed between the first and second support sub-structures 214a1, 214a2.

Following the bonding of the second and third chips 210 and 216 to each other, the reflow process 219 may be performed. The process 219 may reflow the bond between the first and second chips 202 and 210, and may simultaneously reflow the bond between the second and third chips 210 and 216.

FIG. 4C shows a view 403 of the first interconnect 212 disposed between the first and second chips 202 and 210, e.g. after the reflow process 219. As shown in FIG. 4C, the bonding structure comprising bonding sub-structures 212b1, 212b2 may wet a larger portion of the support structure comprising support sub-structures 212a1, 212a2, and the first and second chips 202 and 210 may be separated by the second distance D2, which may be less than the first distance D1.

The various advantageous effects described above in relation to FIG. 2A to FIG. 2J are also applicable to the embodiments shown in FIG. 4A to FIG. 4C.

Based on the various features of the process flow described above in respect of FIG. 2A to FIG. 2J, FIG. 3A to FIG. 3C, and FIG. 4A to FIG. 4C, methods 500 and 600 for manufacturing a chip package may be provided.

Figure 5:
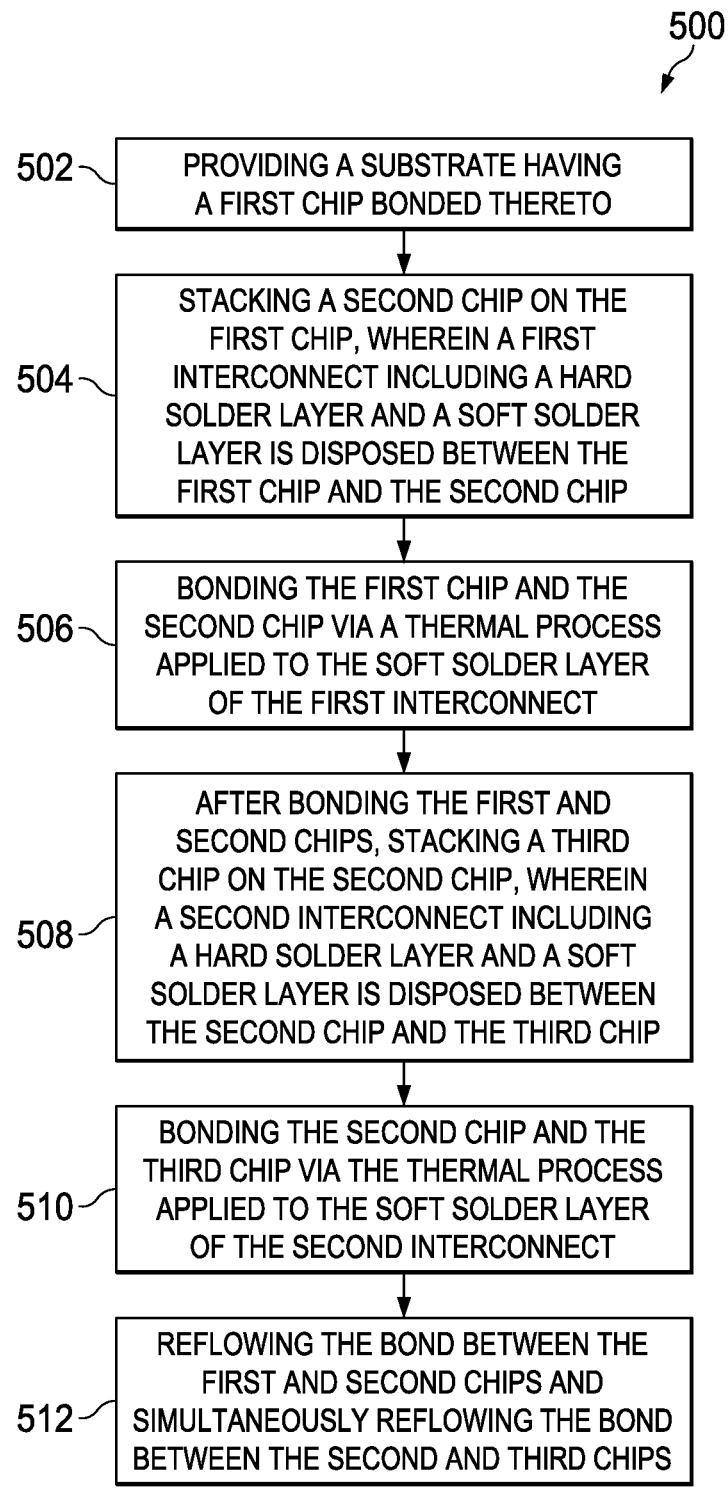
FIG. 5 and FIG. 6 show methods of manufacturing a chip package, in accordance with some embodiments.

FIG. 5 shows a method 500 of manufacturing a chip package.

The method 500 includes: providing a substrate having a first chip bonded thereto (in 502); stacking a second chip on the first chip, wherein a first interconnect including a hard solder layer and a soft solder layer is disposed between the first chip and the second chip (in 504); bonding the first chip and the second chip via a thermal process applied to the soft solder layer of the first interconnect (in 506); after bonding the first and second chips, stacking a third chip on the second chip, wherein a second interconnect including a hard solder layer and a soft solder layer is disposed between the second chip and the third chip (in 508); bonding the second chip and the third chip via the thermal process applied to the soft solder layer of the second interconnect (in 510); and reflowing the bond between the first and second chips and simultaneously reflowing the bond between the second and third chips (in 512).

Figure 6:
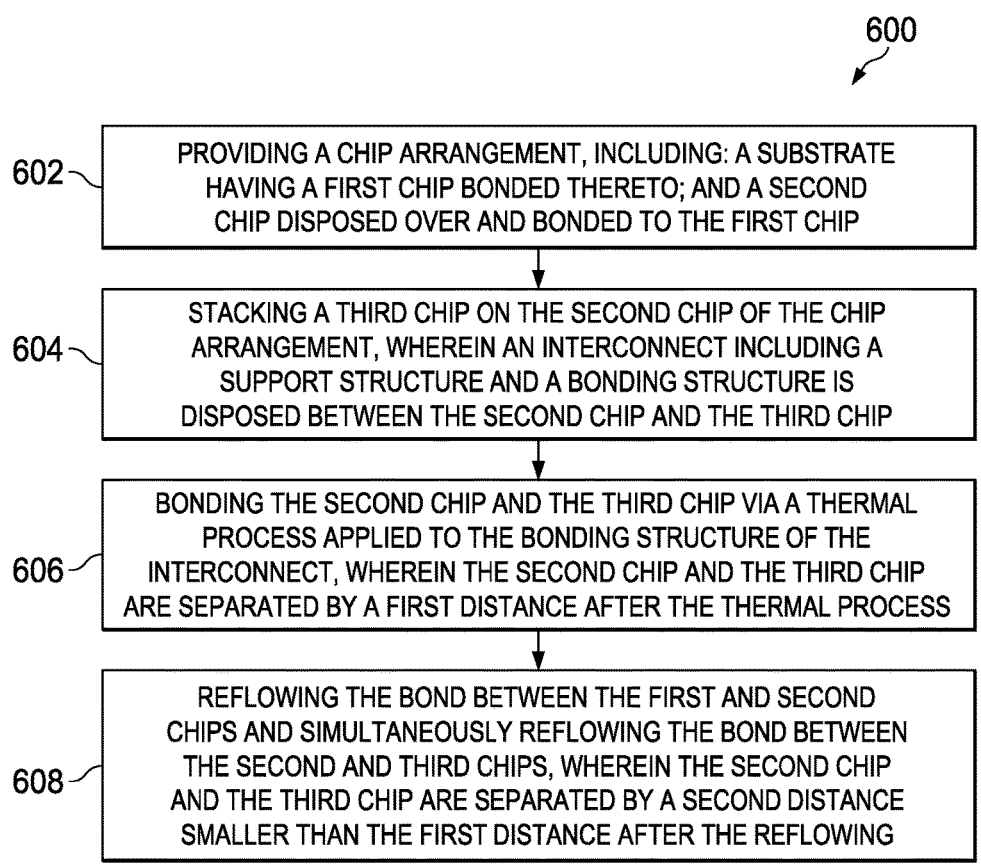

FIG. 6 shows a method 600 of manufacturing a chip package.

The method 600 includes: providing a chip arrangement, including: a substrate having a first chip bonded thereto; and a second chip disposed over and bonded to the first chip (in 602); stacking a third chip on the second chip of the chip arrangement, wherein an interconnect including a support structure and a bonding structure is disposed between the second chip and the third chip (in 604); bonding the second chip and the third chip via a thermal process applied to the bonding structure of the interconnect, wherein the second chip and the third chip are separated by a first distance after the thermal process (in 606); and reflowing the bond between the first and second chips and simultaneously reflowing the bond between the second and third chips, wherein the second chip and the third chip are separated by a second distance smaller than the first distance after the reflowing (in 608).

The various advantageous effects described above in relation to FIG. 2A to FIG. 2J are also applicable to the methods 500 and 600.

According to various embodiments presented herein, a method for manufacturing a chip package is provided. The method may include: providing a substrate having a first chip bonded thereto; stacking a second chip on the first chip, wherein a first interconnect including a support structure and a bonding structure is disposed between the first chip and the second chip; bonding the first chip and the second chip via a thermal process applied to the bonding structure of the first interconnect; after bonding the first and second chips, stacking a third chip on the second chip, wherein a second interconnect including a support structure and a bonding structure is disposed between the second chip and the third chip; bonding the second chip and the third chip via the thermal process applied to the bonding structure of the second interconnect; and reflowing the bond between the first and second chips and simultaneously reflowing the bond between the second and third chips.

According to various embodiments presented herein, a method for manufacturing a chip package is provided. The method may include: providing a substrate having a first chip bonded thereto; stacking a second chip on the first chip, wherein a first interconnect including a hard solder layer and a soft solder layer is disposed between the first chip and the second chip; bonding the first chip and the second chip via a thermal process applied to the soft solder layer of the first interconnect; after bonding the first and second chips, stacking a third chip on the second chip, wherein a second interconnect including a hard solder layer and a soft solder layer is disposed between the second chip and the third chip; bonding the second chip and the third chip via the thermal process applied to the soft solder layer of the second interconnect; and reflowing the bond between the first and second chips and simultaneously reflowing the bond between the second and third chips.

According to various embodiments presented herein, a method for manufacturing a chip package is provided. The method may include: providing a chip arrangement, including: a substrate having a first chip bonded thereto; and a second chip disposed over and bonded to the first chip; stacking a third chip on the second chip of the chip arrangement, wherein an interconnect including a support structure and a bonding structure is disposed between the second chip and the third chip; bonding the second chip and the third chip via a thermal process applied to the bonding structure of the interconnect, wherein the second chip and the third chip are separated by a first distance after the thermal process; and reflowing the bond between the first and second chips and simultaneously reflowing the bond between the second and third chips, wherein the second chip and the third chip are separated by a second distance smaller than the first distance after the reflowing.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a chip package, the method comprising:
   providing a substrate having a first chip bonded thereto;
   stacking a second chip on the first chip, wherein a first interconnect comprising a first support structure and a first bonding structure is disposed between the first chip and the second chip;
   bonding the first chip and the second chip via a first thermal process applied to the first bonding structure of the first interconnect, the first interconnect having uncovered sidewalls during the thermal process, wherein the first thermal process at least partially melts the first bonding structure and does not melt the first support structure;
   after bonding the first and second chips, stacking a third chip on the second chip, wherein a second interconnect comprising a second support structure and a second bonding structure is disposed between the second chip and the third chip;
   bonding the second chip and the third chip via a second thermal process applied to the second bonding structure of the second interconnect, the second interconnect having uncovered sidewalls during the second thermal process, wherein the second thermal process at least partially melts the second bonding structure and does not melt the second support structure; and
   reflowing the bond between the first and second chips and simultaneously reflowing the bond between the second and third chips via a third thermal process that is different from the second thermal process.

2. The method of claim 1, wherein a melting point of the bonding structure of a respective one of the first and second interconnects is lower than a melting point of the support structure of the respective one of the first and second interconnects.

3. The method of claim 1, wherein a melting point of the bonding structure of a respective one of the first and second interconnects is in a range from about 50° C. to about 160° C., and wherein a melting point of the support structure of the respective one of the first and second interconnects is in a range from about 220° C. to about 260° C.

4. The method of claim 1, wherein a difference between a melting point of the support structure of a respective one of the first and second interconnects and a melting point of the bonding structure of the respective one of the first and second interconnects is greater than or equal to about 100° C.

5. The method of claim 1, wherein the bonding structure of a respective one of the first and second interconnects has a first elastic modulus, wherein the support structures of the respective one of the first and second interconnects has a second elastic modulus, and wherein the first elastic modulus is less than the second elastic modulus.

6. The method of claim 5, wherein the first elastic modulus and the second elastic modulus are less than an elastic modulus of copper.

7. The method of claim 1, wherein the first and second bonding structures of the first and second interconnects comprise at least one of tin, lead, copper, gold, silver, zinc, bismuth, magnesium, antimony, indium and an alloy thereof.

8. The method of claim 1, wherein a temperature of the third thermal process is higher than a temperature of the first thermal process and the second thermal process.

9. The method of claim 1, wherein the first support structure of the first interconnect comprises first and second support sub-structures disposed proximate to a top contact pad of the first chip and a bottom contact pad of the second chip, and wherein the first bonding structure of the first interconnect comprises first and second bonding sub-structures disposed between the first and second support sub-structures.

10. The method of claim 1, wherein the second support structure of the second interconnect comprises first and second support sub-structures disposed proximate to a top contact pad of the second chip and a bottom contact pad of the third chip, and wherein the second bonding structure of the second interconnect comprises first and second bonding sub-structures disposed between the first and second support sub-structures.

11. A method of manufacturing a chip package, the method comprising:
    providing a substrate having a first chip bonded thereto;
    stacking a second chip on the first chip, wherein a first interconnect comprising a first hard solder layer and a first soft solder layer is disposed between the first chip and the second chip;
    bonding the first chip and the second chip via a first thermal process applied to the first soft solder layer of the first interconnect, wherein the first soft solder layer of the first interconnect has uncovered sidewalls during the first thermal process, wherein the first thermal process is performed at a first temperature that melts the first soft solder layer and does not melt the first hard solder layer;
    after bonding the first and second chips, stacking a third chip on the second chip, wherein a second interconnect comprising a second hard solder layer and a second soft solder layer is disposed between the second chip and the third chip;
    bonding the second chip and the third chip via a second thermal process applied to the second soft solder layer of the second interconnect, wherein the second soft solder layer of the second interconnect has uncovered sidewalls during the second thermal process, wherein the second thermal process is performed at a second temperature that melts the second soft solder layer and does not melt the second hard solder layer; and
    reflowing the bond between the first and second chips and simultaneously reflowing the bond between the second and third chips via a third thermal process that is different from the second thermal process.

12. The method of claim 11, wherein the first chip comprises a logic chip, and the second and third chips comprise memory chips.

13. The method of claim 11, wherein a melting point of the hard solder layer of a respective one of the first and second interconnects is higher than a melting point of the soft solder layer of the respective one of the first and second interconnects.

14. The method of claim 11, wherein an elastic modulus of the hard solder layer of a respective one of the first and second interconnects is greater than an elastic modulus of the soft solder layer of the respective one of the first and second interconnects.

15. The method of claim 11, wherein a temperature of the third thermal process is in a range from about 70° C. to about 190° C.

16. The method of claim 11, wherein a temperature of the third thermal process is higher than a temperature of the first thermal process.

17. A method of manufacturing a chip package, the method comprising:
  providing a chip arrangement, comprising:
    a substrate having a first chip bonded thereto; and
    a second chip disposed over and bonded to the first chip;
  stacking a third chip on the second chip of the chip arrangement, wherein an interconnect comprising a support structure and a bonding structure is disposed between the second chip and the third chip;
  bonding the second chip and the third chip via a first thermal process applied to the bonding structure of the interconnect, wherein the sidewalls of the interconnect are uncovered during the first thermal process, wherein the second chip and the third chip are separated by a first distance after the first thermal process, wherein the first thermal process softens the bonding structure and does not soften the support structure; and
  reflowing the bond between the first and second chips and simultaneously reflowing the bond between the second and third chips via a second thermal process that is different from the first thermal process, wherein the second chip and the third chip are separated by a second distance smaller than the first distance after the reflowing.

18. The method of claim 17, wherein the support structure of the interconnect comprises a first solder material, wherein the bonding structure of the interconnect comprises a second solder material, and wherein a melting point of the first solder material is higher than a melting point of the second solder material.

19. The method of claim 17, wherein the bonding structure of the interconnect has a first elastic modulus, wherein the support structure of the interconnect has a second elastic modulus, wherein the first elastic modulus is less than the second elastic modulus, and wherein the first elastic modulus and the second elastic modulus are less than an elastic modulus of copper.

20. The method of claim 17, wherein the first distance is in a range from about 20 μm to about 50 μm, and wherein the second distance is in a range from about 10 μm to about 40 μm.

* * * * *